June 21, 1966 L. SELWITZ 3,256,703

COMPACT LIQUID HEAT EXCHANGER

Filed March 22, 1965 2 Sheets-Sheet 1

INVENTOR
LARRY SELWITZ
BY Gerald A. Koris
ATTORNEY

June 21, 1966 L. SELWITZ 3,256,703

COMPACT LIQUID HEAT EXCHANGER

Filed March 22, 1965 2 Sheets-Sheet 2

INVENTOR
LARRY SELWITZ
BY Gerald A. Koris
ATTORNEY

United States Patent Office 3,256,703
Patented June 21, 1966

3,256,703

COMPACT LIQUID HEAT EXCHANGER

Larry Selwitz, Sherman Oaks, Calif., assignor to North American Aviation, Inc.

Filed Mar. 22, 1965, Ser. No. 441,640
8 Claims. (Cl. 62—3)

The present invention relates to a high heat flux liquid heat exchanger, and more particularly to a heat exchanger for cooling thermoelectric generators and other electronic equipment which is compact and lightweight.

Thermoelectric and other electronic devices generate considerable heat which must be removed for the efficient and continued operation of the devices. In thermoelectric elements, a voltage is developed as a result of a temperature differential created by the passage of heat thereacross in accordance with the Seebeck effect. The thermoelectric elements may comprise a junction of two dissimilar metals such as chromel-constantin, or semiconductor elements such as lead telluride in a P-N array. It is important for the proper functioning of the thermoelectric devices that heat be efficiently removed from the cold side, in order to maintain the necessary temperature differential, and to prevent physical damage to the elements from overheating. Since the heat flux across the elements varies with changing power demands on the thermoelectric system, it is necessary that the heat removal means be of varying capacity able to maintain the surface of the cold side of the thermoelectric element at a relatively constant temperature.

Present heat exchangers for thermoelectric elements, such as conventional natural convection and forced air heat exchangers, are heavy and have limited heat rejection rates per unit area of surface. Metal plate-on-pin fin free convection heat exchangers are comparatively heavy, occupy a large volume of space, and are limited to a heat flux rate of about 11–16 watts per square inch of base plate area. Forced air heat exchangers, while capable of handling high heat fluxes, require electrical power inputs and contain moving parts. In addition, special duct work is needed, inverters may be necessary to operate the blowers, and generator assembly becomes more complicated. As a result, the power-to-weight ratio is low and portability is limited.

The principal object of the present invention, therefore, is to provide a simple, lightweight cooling system particularly adapted for use with thermoelectric and electronic devices.

Another object is to provide a lightweight cooling system for a thermoelectric device, capable of maintaining the cold side of the thermoelectric elements at a fixed temperature with greatly varying heat fluxes.

Another object is to provide a compact liquid heat exchanger for a thermoelectric assembly which will help achieve high thermoelectric generator power-to-weight ratios and is of low cost to fabricate and assemble.

Still another object is to provide such a heat exchanger for a thermoelectric generator which will reduce generator size, weight, and cost.

A further object is to provide a compact, lightweight, portable thermoelectric generator capable of obtaining high heat fluxes and a high power-to-weight ratio.

A still further object is to provide such a generator which may use any burnable material as a heat source and boiling water as the heat sink.

Other objects and advantages of the present invention will become apparent from the following detailed description, accompanying drawings, and the appended claims.

In the figures, FIG. 1 is an overall sectional view, partly in elevation, of the thermoelectric generator, showing the heat exchanger in an expanded position;

The present heat exchanger comprises an expansible liquid container attached to the cold surface of a thermoelectric module. A vaporizable liquid coolant in the container covers the cold surface of the thermoelectric module, and as the thermoelectric device is operated the liquid heats up from ambient temperature to its boiling point. As the liquid begins to boil, vapor is generated, increasing the pressure inside the expansible, flexible container. The increasing rate of boiling, and hence increasing pressure, inflates the container to an expanded position, providing a large surface area which the vapor can contact. Upon contacting the cooler surface, the vapor condenses, flows down the side of the container surfaces, and returns to the boiling liquid. The container, in turn, rejects heat to the environment, by radiation and natural convection. The evaporation-condensation cycle in the container is continuous, and is in effect over the entire inner surface of the inflated liquid container. Although the condensation process is capable of very high heat transfer rates, the rate that the heat can be carried away is limited by free air convection and radiation. Efficient heat transfer to the surface of the expansible member is considerably promoted by the fact that the surface of the member expands only upon the urging of the vapor; thus, little permanent gas is in the vapor space to cause gas binding which would result in reduced heat transfer.

The present boiling liquid heat exchanger possesses the characteristics of lightweight and high heat removal rates. High $\Delta$ T's and hence high voltages are attained across the thermoelectric elements while controlling the temperature of the module cold side. The materials and assembly are low in cost and, as a result of the weight reduction, high power-to-weight ratios are obtained. During non-operational periods the heat exchanger returns to a collapsed position, increasing portability of the generator.

Figure 1:
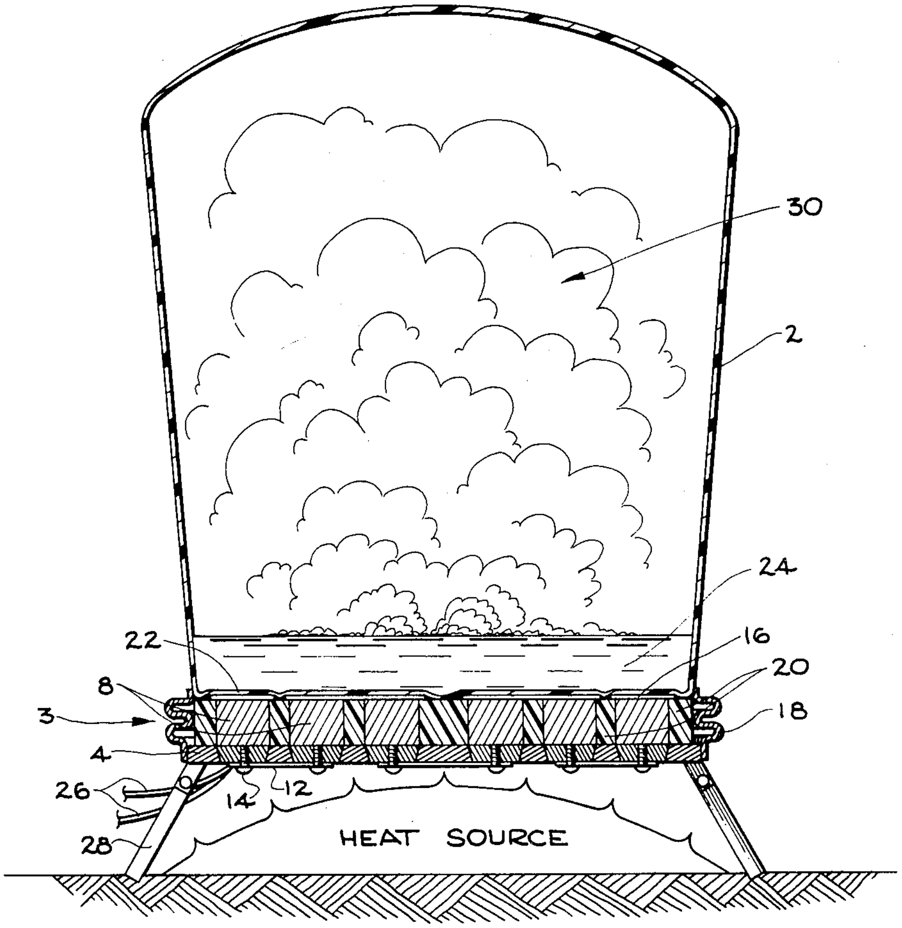

A more detailed description of the invention will now follow, beginning with reference to FIG. 1 which shows the expansible heat exchanger 2 in an expanded position. The container 2 is flexible, lightweight, and thermally stable to elevated operating temperatures such as 250° F. Containers meeting these requirements are high temperature plastic films such as of polyesters, metallized plastic films, thin metal bellows, and high temperature fabrics which do not absorb the liquid coolant. In all cases, the material chosen must be chemically compatible with the liquid it is to contain. A particularly suitable container is fabricated from a thin film of Mylar (polyethylene terephthalate resin). Another very satisfactory container film is composed of Mylar coated with a metallizing layer of aluminum.

Figure 3:
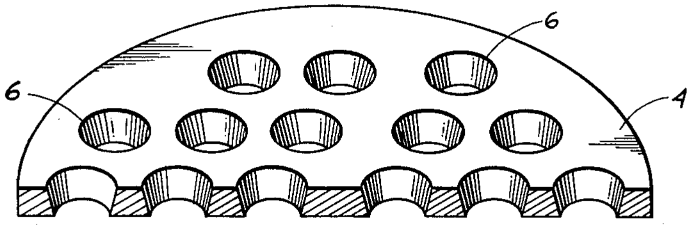
FIG. 3 is a perspective view of a portion of the mounting template for the thermoelectric elements.
Figure 4:
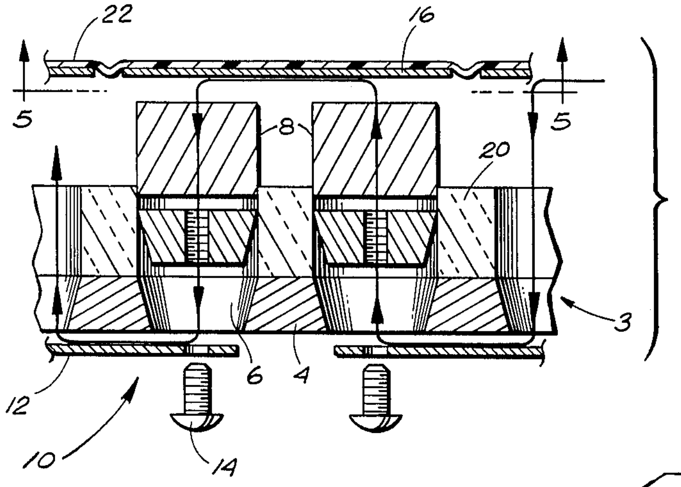
FIG. 4 is an enlarged, partly exploded, vertical section showing the mounting of the thermoelectric elements in the template.

The thermoelectric module 3 has for its basic structure a thin, disc-shaped plate 4, which may be a ceramic, stainless steel, or preferably aluminum. A plurality of closely spaced, tapered holes 6 are machined in the plate (FIG. 3). Thermoelectric elements 8 are bonded to tapered hot shoes 10 which are of the same thickness as the plate. As seen in FIGS. 1 and 4, the elements are then set into tapered holes 6 in a R-N array. The fact that hot shoes 10 fit through the template eliminates any hot temperature drop losses. A temperature drop of at least 300° F. across the material can be maintained. The elements are connected in series by means of straps 12 attached to the hot shoes, which together with screws 14 lock elements 8 to template 4. The cold shoes 16 serve as electrical connectors on the module cold side. The electrical current path obtained with this arrangement is shown by the arrow flow in FIG. 4.

A protective outer shroud 18 in the form of a thin-walled bellows, such as of stainless steel, is fastened to the outside edge of template 4. The bellows configuration thereof minimizes heat shunt loss. An efficient thermal insulation 20, such as the ceramic sold under the trademark Min-K, is packed between the module and the outer shroud and between the thermoelectric elements mounted in the template.

Figure 5:
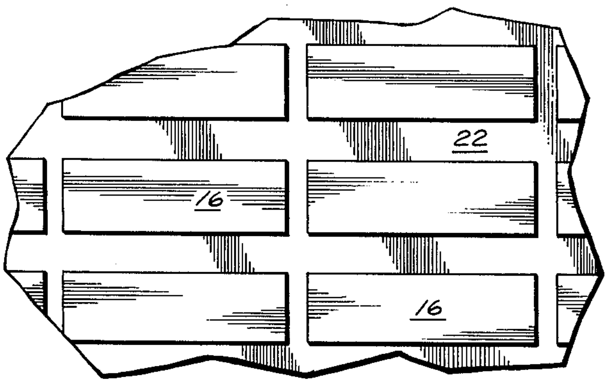
FIG. 5 is a plan view taken along lines 5—5 of FIG. 4.

The cold side of thermoelectric module 3 is made fluid-impermeable with any of several means 22 known to the art (see FIGS. 4 and 5). For example, the module may be made waterproof by spraying it with a liquid silicone rubber, applying a thin waterproof film over the cold side, or sealing between the couples with a high temperature (over 250° F.) flexible potting compound. In all cases, the cold shoes 16 of the couples must be electrically insulated from the coolant 24. The heat exchanger is also sealed to the perimeter of the cold side of module 3 by suitable means. Sealing of Mylar is readily accomplished, for example, with silicone rubber. Both Mylar and silicone rubber have good stability up to about 350° F. The liquid coolant can be put directly into the container, and the container sealed, or a spout containing a cap opening (not shown) can be made part of the container for filling at convenience. The cap for the spout may also contain a pressure relief valve.

The coolant 24 may be selected from a number of vaporizable fluids, including water and organic liquids which boil at a selected operating temperature for a particular thermoelectric material. Such organic coolants include petroleum ether, acetone, and Freons such as trichlorotrifluoroethane; others may be selected by those skilled in the art. Water is the preferred fluid in view of its satisfactory heat capacity, boiling point, availability, and other properties. Very little coolant fluid is required for the thermoelectric module in view of the efficient heat transfer of the boiling fluid. For example, a 30-watt output generator (600 watts heat input) can be cooled using only 4 oz. of water and 2 oz. of 1-mil Mylar for the container. If the container is sealed after the water is added, it will be retained for the life of the generator.

Figure 2:
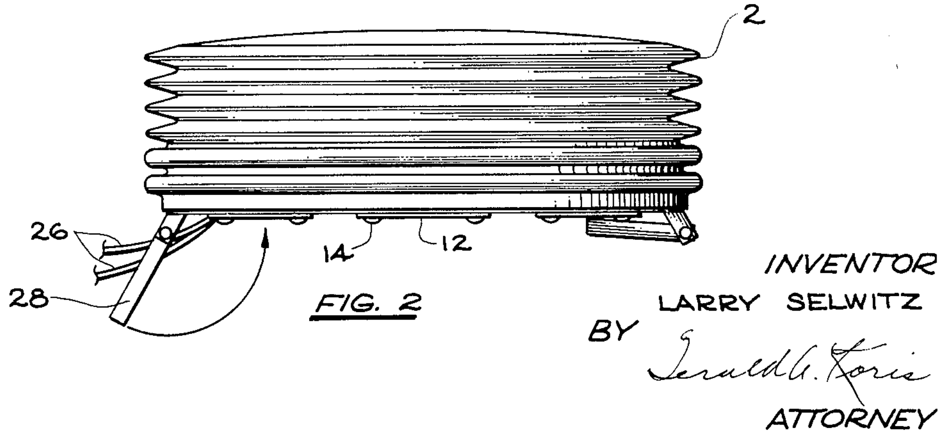
FIG. 2 is an elevation view of the thermoelectric generator in a non-operational position with a collapsed heat exchanger.

The structure of the thermoelectric generator is completed with electrical leads 26 from the series-connected thermoelectric elements 8, and three lightweight, collapsible legs 28 which are attached to the template to form a tripod-type support. When the generator is not being operated, the legs may be folded to the sides of the generator as seen in FIG. 2, which also shows the heat exchanger in a collapsed position, which makes a neat, compact package for easy portability. For the generator referred to in the previous paragraph, the Mylar container collapses to a stack only ½ in. high. The heat source, which may be any combustible material, is placed between the legs underneath the plate. The power output of the generator is primarily a function of two variables: disc diameter and hot side temperature. It is seen that the present thermoelectric generator is modular in the sense that the size may vary in direct proportion to the number of thermoelectric elements used.

In operation of the thermoelectric generator described above, heat is conducted through the thermoelectric module and into coolant 24. After a short period of time the liquid heats up from ambient temperature to its boiling point to form vapor 30. As the fluid is vaporized, the pressure inside container 2 is increased. The increasing rate of boiling, and hence increase in pressure, inflates the container in proportion to the heat load providing a proportionally larger surface area with which the vapor can come into contact, until the inflated position shown in FIG. 1 is reached from the collapsed starting position of FIG. 2. Thus, at all times, the heat exchanger surface area is proportional and responsive to the heat load being generated across the thermoelectric module.

The following table presents a weight analysis for a generator employing a 6-in. diameter aluminum template and serves as a specific example of the present invention.

*Table*

| | |
|---|---|
| Template diameter ____ inches__ | 6.0 |
| Template weight ____ grams__ | 236 |
| Number of thermoelectric elements (lead telluride) ____ | 180 |
| Element weight ____ grams__ | 1480 |
| Weight of shoes, screws, straps ____ do____ | 129 |
| Insulation weight ____ do____ | 11.5 |
| Heat exchanger weight ____ do____ | 8 |
| Weight of enclosure, base and sealant ____ do____ | 93 |
| Total weight ____ do____ | 1957 |
| Total plus 10% miscellaneous weight ____ do____ | 2153 |
| Total weight ____ lbs__ | 4.7 |

It is noted that the total generator weight is only 1.4 times the weight of the thermoelectric elements alone. The principal operating parameters of the system are:

$T_c$—100° C.

$T_h$—300° C.

Voltage—0.063 volt per couple or total 5.7 volts.

Power—0.39 watt per couple (corrected for internal resistances).

Total power—35 watts.

The foregoing example should be understood to be illustrative rather than restrictive of the present invention. It is apparent that various design modifications may be made by those skilled in the art within the scope of the present teaching. It is understood, therefore, that the present invention is limited only as is indicated in the appended claims.

Having thus described the invention, I claim:

1. A cooling system for an electronic apparatus comprising an expansible container member attached to one surface of said apparatus, said member having an outer surface directly facing the environment external of said system, a vaporizable coolant fluid disposed within said container in contact with said surface, the vapor generated by boiling of said fluid causing the expansion of said container in response thereto, thereby cooling said apparatus.

2. The system of claim 1 wherein said fluid is water.

3. A compact cooling system for a thermoelectric apparatus comprising an expansible container member sealed to the cold operating surface of a thermoelectric module, said member having an outer surface directly facing the environment external of said system, an electrical and fluid insulator disposed over said cold surface, and a coolant fluid positioned within said container upon the surface of the insulated cold surface, the boiling of said fluid in the operation of said thermoelectric device causing the expansion of said expansible container, the surface area of said container expanding in proportion to the vapor generated by the boiling of said coolant fluid.

4. A compact, high efficiency heat exchanger for a thermoelectric apparatus, comprising a thermoelectric module, an expansible container member of a thin plastic film sealed to the perimeter of and enclosing the cold operating surface of said module, the outer surface of said expansible member directly facing the environment external of said system, an electrical insulator and fluid sealant disposed over said cold surface, water positioned within said container upon the surface of said insulated cold surface, the vapor generated by the boiling of water in response to the heat generated in operation of said thermoelectric apparatus causing the expansion of said expansible container in proportion thereto, said vapor condensing upon said container surface and returning to said cold surface, thereby cooling said module.

5. A compact, portable, lightweight thermoelectric generator, comprising a mounting template having a plurality of spaced holes therein, an array of thermoelectric elements positioned in said holes having hot and cold surfaces, said thermoelectric elements connected in electrical series, the bottom hot surface of said thermoelectric elements adapted to face a heat source, the top cold surface of said thermoelectric elements sealed with a fluid and electrical insulator, an expansible container sealed to the perimeter of said mounting template on said cold surface, said container having an outer surface directly facing the environment external of said system, and a fluid disposed within said container in contact with said cold surface, the vapor generated by the boiling of said fluid causing the expansion of said container in response thereto, thereby cooling said apparatus.

6. A compact, portable, lightweight thermoelectric generator, comprising a thin metal mounting template having a plurality of spaced holes therein, thermoelectric elements positioned in said holes, means for connecting said thermoelectric elements in series, said means securing said thermoelectric elements to said template, one surface of said mounting template adapted to face a heat source, an expansible thin, plastic container sealed to the perimeter of the other surface of said mounting template, an electrical insulator and fluid sealant means covering the last-named surface of said mounting template, water positioned within said container upon said insulator means, the boiling of said water in the operation of said thermoelectric apparatus causing the expansion of said container in proportion to the vapor generated, said vapor condensing upon the surface of said container and returning to said water, thereby cooling said generator.

7. A cooling system for an electronic apparatus comprising an expansible container of a thin, plastic film attached to one surface of said apparatus, a vaporizable coolant fluid disposed within said container in contact with said surface, the vapor generated by boiling of said fluid causing the expansion of said container in response thereto, thereby cooling said apparatus.

8. A compact, portable, lightweight thermoelectric generator, comprising a mounting template having a plurality of spaced holes therein, an array of thermoelectric elements positioned in said holes having hot and cold surfaces, said thermoelectric elements connected in electrical series, the bottom hot surface of said thermoelectric elements adapted to face a heat source, the top cold surface of said thermoelectric elements sealed with a fluid and electrical insulator, an expansible, thin, plastic container sealed to the perimeter of said mounting template on said cold surface, and a fluid disposed within said container in contact with said cold surface, the vapor generated by the boiling of said fluid causing the expansion of said container in response thereto, thereby cooling said apparatus.

References Cited by the Examiner

UNITED STATES PATENTS

| | | | |
|---|---|---|---|
| 2,986,890 | 6/1961 | Bevans | 62—3 |
| 2,989,281 | 6/1961 | Fritts | 62—3 |
| 3,052,100 | 9/1962 | Homkes | 62—3 |
| 3,082,276 | 3/1963 | Corry | 62—3 |
| 3,091,940 | 6/1963 | Feldman | 62—3 |

WILLIAM J. WYE, *Primary Examiner.*